(12) United States Patent
Seko et al.

(10) Patent No.: US 7,582,976 B2
(45) Date of Patent: Sep. 1, 2009

(54) SEMICONDUCTOR DEVICE TAPE CARRIER, MANUFACTURING METHOD FOR SEMICONDUCTOR DEVICE, SEMICONDUCTOR DEVICE, AND SEMICONDUCTOR MODULE DEVICE

(75) Inventors: Toshiharu Seko, Yamatokoriyama (JP); Kenji Toyosawa, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/896,827

(22) Filed: Sep. 6, 2007

(65) Prior Publication Data

US 2008/0061432 A1 Mar. 13, 2008

(30) Foreign Application Priority Data

Sep. 8, 2006 (JP) ............... 2006-244782

(51) Int. Cl.
*H01L 23/48* (2006.01)
*H01L 23/52* (2006.01)
*H01L 29/40* (2006.01)

(52) U.S. Cl. .............. 257/786; 257/E23.065; 257/734; 257/702

(58) Field of Classification Search ........ 257/724, 257/E21.503, E23.055, E23.065, E23.133
See application file for complete search history.

(56) References Cited

U.S. PATENT DOCUMENTS 6,911,729 B1 * 6/2005 Chikawa ............ 257/724

7,442,074 B2 * 10/2008 Shimoishizaka et al. .... 439/493
2006/0097368 A1 * 5/2006 Seko ..................... 257/668

FOREIGN PATENT DOCUMENTS

JP 2000-323533 11/2000
JP 2001-110853 4/2001

* cited by examiner

*Primary Examiner*—Fernando L. Toledo
*Assistant Examiner*—Mamadou Diallo
(74) *Attorney, Agent, or Firm*—Harness, Dickey & Pierce, P.L.C.

(57) ABSTRACT

The present invention provides a semiconductor device tape carrier formed of an insulative tape 1 of a thin film, which becomes a semiconductor device by conducting a plurality of wire patterns 11 on its surface to a bump 23 of a semiconductor element 21 and being sealed by an insulative resin 22, wherein: an outer dimension of the semiconductor device in a carriage direction of the insulative tape 1 is greater than an integral multiple X (X=1, 2, 3, 4, 5, . . . ) of a pitch interval of sprocket holes 2, which are openings formed to carry the insulative tape 1, and not more than: the integral multiple X+a decimal Y (0<Y<1), and the tape pitch for a single semiconductor device is set to the integral multiple X+a decimal Y (0<Y<1). In this way, the manufacturing method for semiconductor device, the semiconductor device, and the semiconductor module device for a tape carrier type semiconductor device according to the present invention reduces an unformed region of the insulative tape 1 which is irrelevant to the outer dimension of the semiconductor device.

12 Claims, 13 Drawing Sheets

(1 device pitch=4.5P)

cut-off region of tape material (1 device pitch=4.5P)

cut-off region of tape material (1 device pitch=4.5P)   cut-off region of tape material (1 device pitch=4.5P)   cut-off region of tape material (1 device pitch=4.25P)

cut-off region of tape material (1 device pitch=4.25P)

cut-off region of tape material (1 device pitch = 4P)

cut-off region of tape material generated by reduction in outer shape

⇩

(1 device pitch = 3.5P)

cut-off region of tape material generated by reduction in outer shape cut-off region of tape material (1 device pitch = 3P)

(1 device pitch = 2.5P)

(1 device pitch=5P)

(1 device pitch=5P)

(1 device pitch=5P)

(1 device pitch=5P)

(device pitch=2/9P)    cut-off region of tape material (1 device pitch=5P)

(device cutting pitch: 5P)

SEMICONDUCTOR DEVICE TAPE CARRIER, MANUFACTURING METHOD FOR SEMICONDUCTOR DEVICE, SEMICONDUCTOR DEVICE, AND SEMICONDUCTOR MODULE DEVICE

This Nonprovisional application claims priority under 35 U.S.C. § 119(a) on Patent Application No. 2006/244782 filed in Japan on Sep. 8, 2006, the entire contents of which are hereby incorporated by reference.

FIELD OF THE INVENTION

The present invention relates to a tape carrier used for a semiconductor device composed of semiconductor elements adhered/mounted on a flexible wiring substrate; semiconductor device; semiconductor module; and a manufacturing method for semiconductor device.

BACKGROUND OF THE INVENTION

The present invention relates to a tape carrier used for a semiconductor device composed of semiconductor elements bonded/mounted onto a flexible wiring substrate called COF (Chip On Film) or TCP (Tape carrier Package)(these semiconductor devices will be referred to simply as COF and TCP, hereinafter); semiconductor device; semiconductor module; and a manufacturing method for semiconductor device.

FIG. 15 is a plan view showing a conventional tape carrier 500 for COF semiconductor device (before mounting semiconductor element). FIG. 16 is a plan view showing a conventional COF semiconductor device.

FIG. 17 is a plan view showing a conventional tape carrier 600 for TCP semiconductor device (before mounting semiconductor element). FIG. 18 is a plan view showing a conventional TCP semiconductor device.

The following (a) to (d) are the differences between TCP and COF.

(a) A TCP includes an insulative tape 501 with an opening section 516 in a portion where a semiconductor element 521 is mounted, and the tips of the wire patterns 511 projected like cantilevers are bonded with a semiconductor element 521. A COF does not include an element-mounting opening section for mounting the semiconductor element 521, and the semiconductor element 521 is bonded/mounted onto the wire patterns 511 formed on the surface of the insulative tape 501 of a thin film.

(b) Because the wire patterns 511 of the TCP are projected like cantilevers, the thickness of each wire pattern 511 is set to 18 µm or greater, and therefore it is difficult to produce a wire patterns 511 with a wiring pitch smaller than 45 µm. Meanwhile, the COF uses wire patterns 511 formed on the surface of the insulative tape 501 which is a thin film, and it is possible to form wire patterns 511 with a thickness of equal to or less than 8 µm and a wiring pitch equal to or less than 35 µm.

(c) In the TCP, a slit 517 is formed in advance in a folding part to be folded after the device is mounted to a liquid crystal panel or the like. Meanwhile, the COF does not have a slit to be folded, and can be folded at anywhere on the insulative tape 501 of a thin film.

(d) The TCP has an insulative tape 501 made of polyimide on which a copper foil is laminated through an adhesive. Meanwhile, in the COF, polyimide or the like is applied on the rear surface of a copper foil and then the application layer is cured (casting technology), or by laminating copper on an insulative tape 501 of polyimide or the like by sputtering (metalization technology).

In consideration of its usage, the COF includes an insulative tape 501 of a thin film which can be freely folded, and each wire of the wire patterns 511 formed on the insulative tape 501 of thin film is conducted to a corresponding terminal of the semiconductor element 521. An external connection section 512 is conducted to a liquid crystal panel, a printed circuit-board or the like. The rest of wire pattern exposing section is coated with a solder resist 513 to have an insulative property. The solder resist 513 is not applied on a mounting region 515 where the semiconductor element 521 is mounted, and a solder resist opening section 514 is provided instead. After mounted to the mounting region 515 on the insulative tape 501 of a thin film, the semiconductor element 521 is sealed by a resin 522.

In both of the COF and TCP, the insulative tape 501 of a thin film often has openings for a carriage purpose at a 4.75 mm interval, which are called sprocket holes 502, and the tape pitch according to the outer shape of the product is designed to have a pitch of an integral multiple of the pitch of the sprocket holes 502. The tape is carried among the facilities of the production process on 1-pitch basis of the sprocket holes 502. As a result, the part corresponding to the outer dimension pitch (an integral multiple) of a product is carried for each manufacturing step (a step of processing/carrying a single device).

There is no published patent applications or documents of TCP regarded a prior art of a method for disposing products on the insulative tape 501 of a thin film and its manufacturing method including the carriage. The same art for COF is disclosed in Japanese Laid-Open patent application Tokukai 2000-323533 (published on Nov. 24, 2000, U.S. Pat. No. 3,558,921 registered on May 28, 2004, "Patent Document 1" hereinafter).

However, the described conventional semiconductor device tape carrier, manufacturing method for semiconductor device, semiconductor device, and semiconductor module device have a problem of an increase in material/processing cost and a decrease in manufacturing performance due to an increase in outer dimension of product size of COF or TCP and tape pitch.

In both of COF and TCP, the tape pitch according to the outer dimension of the product is generally designed to have a pitch of an integral multiple of the pitch of the sprocket holes 502, which is about 5 pitches on an average, though it depends on its usage. However, the outer dimension of the product rarely corresponds exactly to an integral multiple of the pitch of the sprocket holes 502 (5 pitch in average), and often includes an unformed region (unnecessary region) 503 which does not serve as a part of the product. As a result, there will be some wastes of material/processing cost and manufacturing performance.

For example, an unformed region (unnecessary region) corresponding to ½ pitch (half pitch) requires extra about 10% of material cost.

This problem can be solved by reduction in outer dimension of the product. The reduction in outer dimension of the product greatly depends on the outer shape/size or layout flexibility of wire patterns 511, and it raises an important and difficult problem of compatibility with the user specification. Therefore, there has been a significant difficulty in reduction in outer dimension.

In this view, for example, Patent Document 1 discloses a technology for a layout of outer shape of the product so as to reduce the unformed region 503 of the tape carrier 700 which does not contribute to the fabrication of the product.

FIG. 19 is a plan view showing an example of the conventional technique of Patent Document 1.

The example of FIG. 19 shows a manufacturing method for a COF semiconductor device. The method of Patent Document 1 is applicable to a COF semiconductor device and a TCP semiconductor device. The following describes a case of a COF semiconductor device.

In the method of Patent Document 1 discloses a product in which a part of the outer shape including the external connection section 512 is protruded wherein two protruded parts are adjacently disposed. With this arrangement, the unnecessary region in the vicinity of the projection section can be reduced.

With this layout, the practical length of the tape carrier 700 is reduced.

The above example reduces the unformed region 503 by oppositely disposing the two external connection sections 512, thereby reducing the practical tape pitch of the tape carrier 700. However, such minimization in tape pitch of the tape carrier 700 by oppositely disposing the external connection sections 512 may not always useful for various COFs of different shapes, and each COF requires a change in disposition direction of the components on the tape carrier 700 according to its shape.

Moreover, since the products are oriented to plural different directions in the foregoing layout, the manufacturing is required to be carried out by switching the mounting directions of the respective components onto the tape carrier 700 according to the disposition direction of the COF. To meet this requirement, reduction in tape pitch of the tape carrier 700 and simplification of manufacturing process both need to be taken into account in the designing.

SUMMARY OF THE INVENTION

The present invention is made to solve the problems which come along with increases in outer dimension of product or tape pitch in a COF or TCP, such as an increase in material/processing cost or a decrease in manufacturing performance. The present invention provides a semiconductor device tape carrier; manufacturing method for semiconductor device; semiconductor device; and semiconductor module device for COF or TCP, which achieves reduction of unformed region (unnecessary region) of the tape not included in the outer shape of the product, and reduction in material cost by about 10%.

In order to solve the foregoing problems, a COF or TCP semiconductor device tape carrier according to the present invention is formed of an insulative tape of a thin film, which becomes a COF or TCP semiconductor device by conducting a plurality of wire patterns on its surface to a protruding electrode of a semiconductor element and being sealed by an insulative resin, wherein: an outer dimension of the COF or TCP semiconductor device in a carriage direction of the insulative tape is greater than an integral multiple X (X=1,2,3,4,5, . . . ) of a pitch interval of sprocket holes, which are openings formed to carry the insulative tape, and not more than: the integral multiple X+a decimal Y (0<Y<1). In this way, a tape pitch of the insulative tape which becomes a COF or TCP semiconductor device, which is generally set to an integral multiple X+1, is set to an integral multiple X+a decimal Y (0<Y<1), and an unformed region of the insulative tape which is irrelevant to the outer dimension of the semiconductor device can be reduced.

This invention makes it possible to reduce the unformed region (unnecessary region) of the insulative tape which does not contribute to the outer dimension of a semiconductor device, and reduces material cost.

Additional objects, features, and strengths of the present invention will be made clear by the description below. Further, the advantages of the present invention will be evident from the following explanation in reference to the drawings.

DESCRIPTION OF THE EMBODIMENTS

First Embodiment

Figure 1:
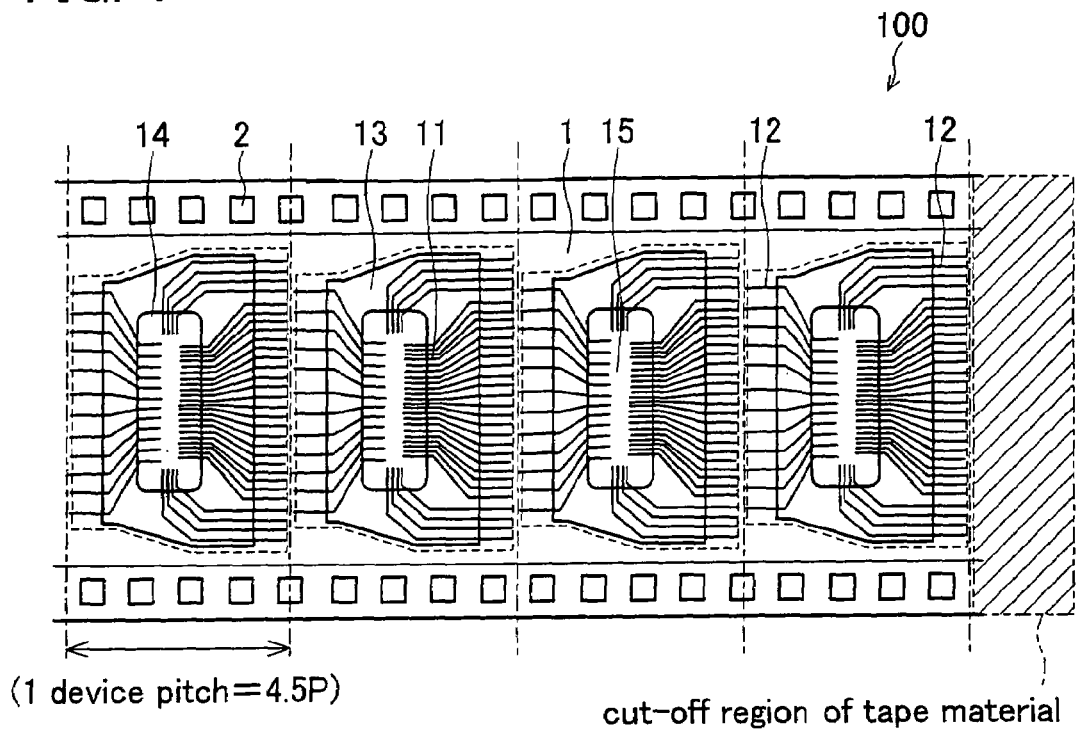
FIG. 1 is a plan view showing a tape carrier for COF semiconductor device (before mounting semiconductor element) according to an embodiment of the present invention.
Figure 2:
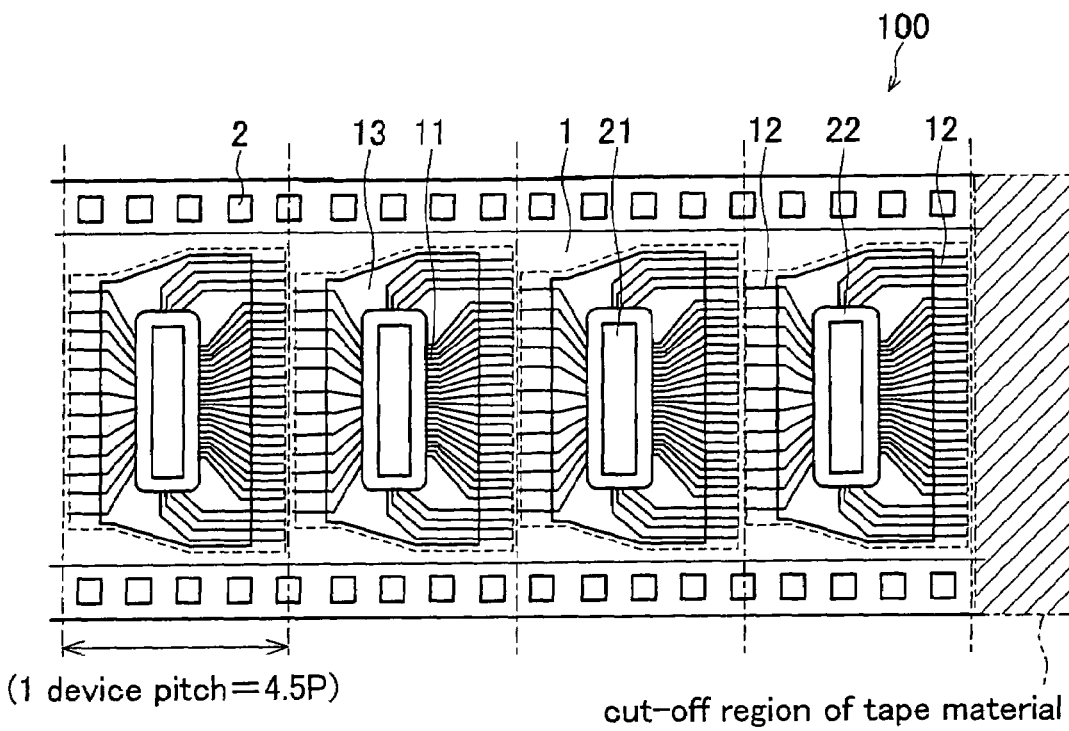
FIG. 2 is a plan view showing the tape carrier of FIG. 1 on which a semiconductor element is mounted (semiconductor device), according to the embodiment of FIG. 1 of the present invention.
Figure 3:
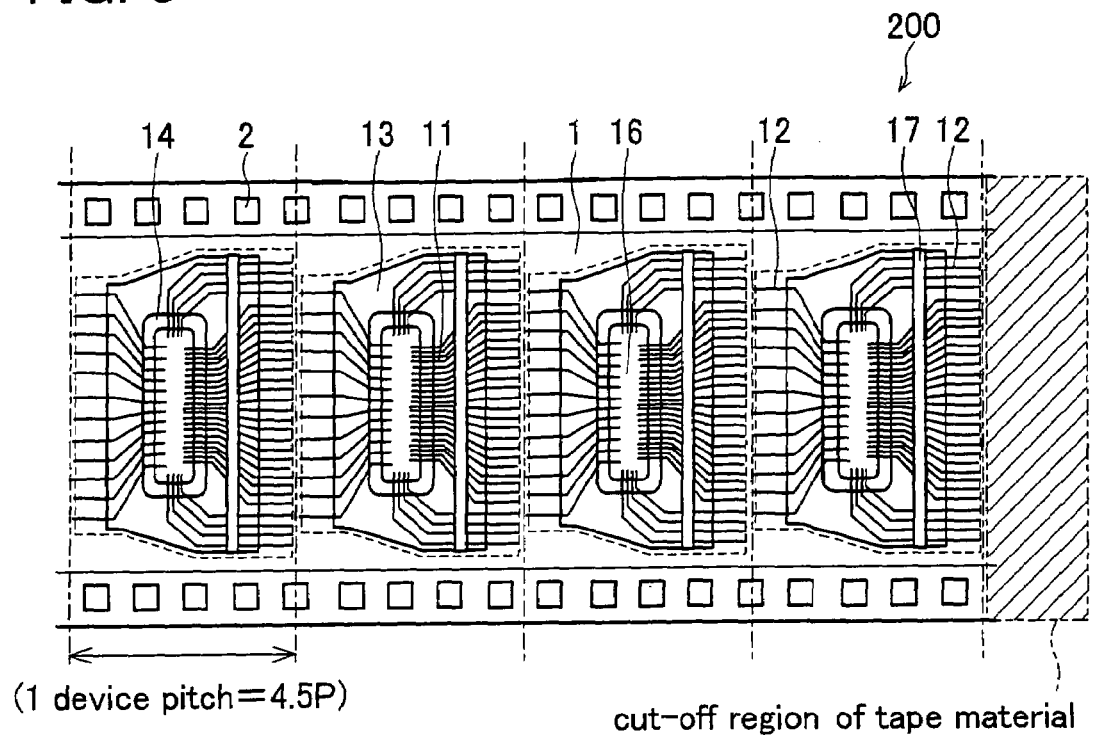
FIG. 3 is a plan view showing a tape carrier for TCP semiconductor device (before mounting semiconductor element), according to another embodiment of the present invention.
Figure 4:
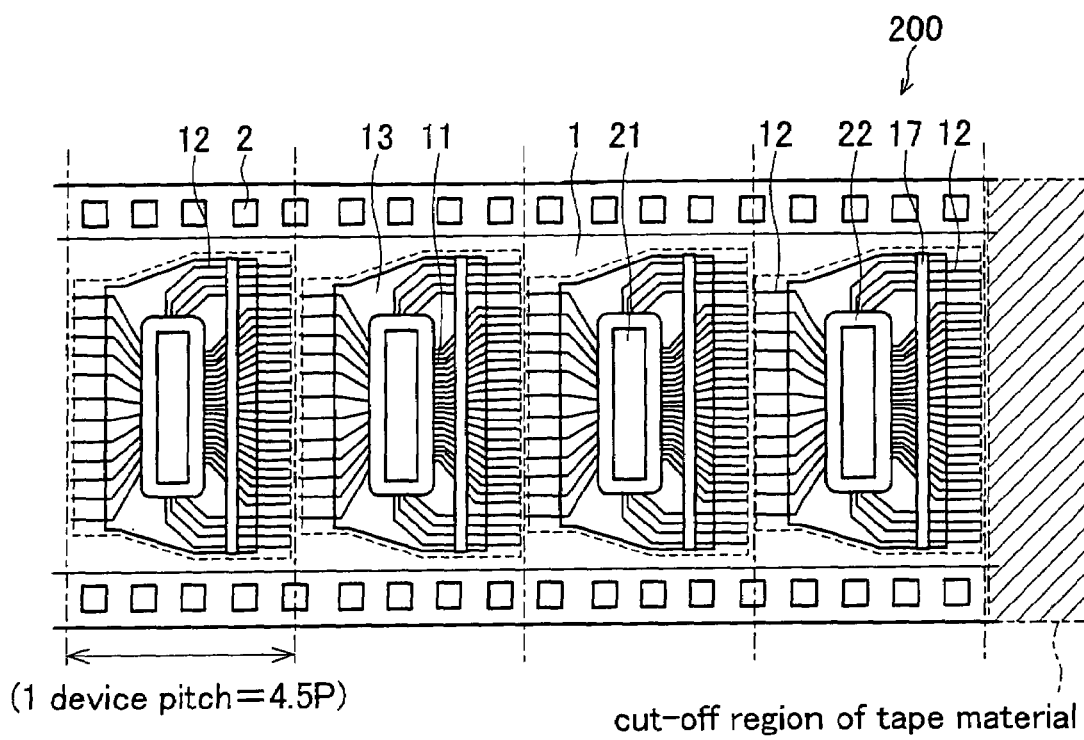
FIG. 4 is a plan view showing the tape carrier of FIG. 3 on which a semiconductor element is mounted (semiconductor device), according to the embodiment of FIG. 3 of the present invention.
Figure 5:
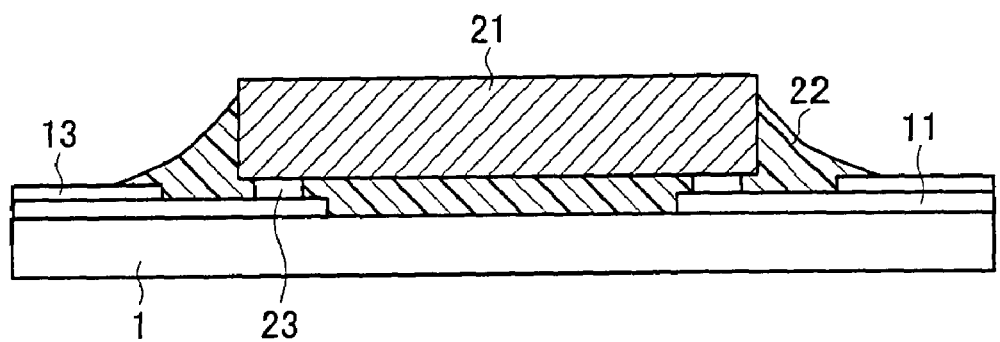
FIG. 5 is a cross-sectional view showing a COF semiconductor device according to an embodiment of the present invention, corresponding to the embodiment of FIGS. 1 and 2.
Figure 6:
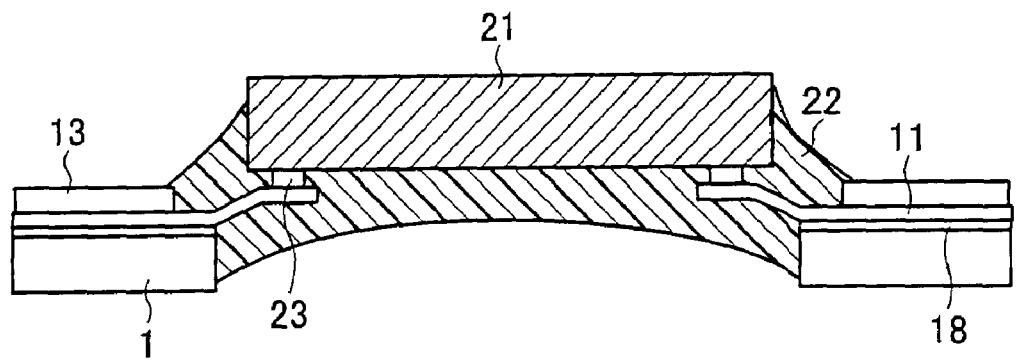
FIG. 6 is a cross-sectional view showing a TCP semiconductor device according to an embodiment of the present invention, corresponding to the embodiment of FIGS. 3 and 4.
Figure 7:
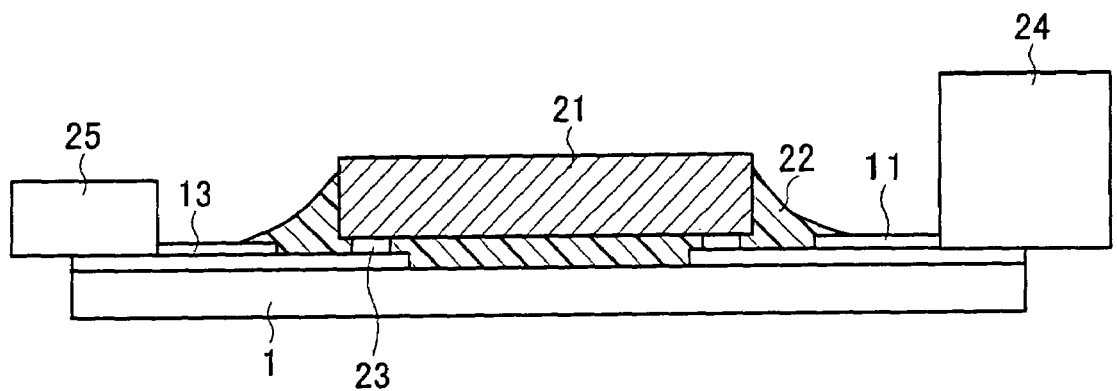
FIG. 7 is a cross-sectional view showing a semiconductor module device according to an embodiment of the present invention, corresponding to the embodiment of FIG. 5.
Figure 8:
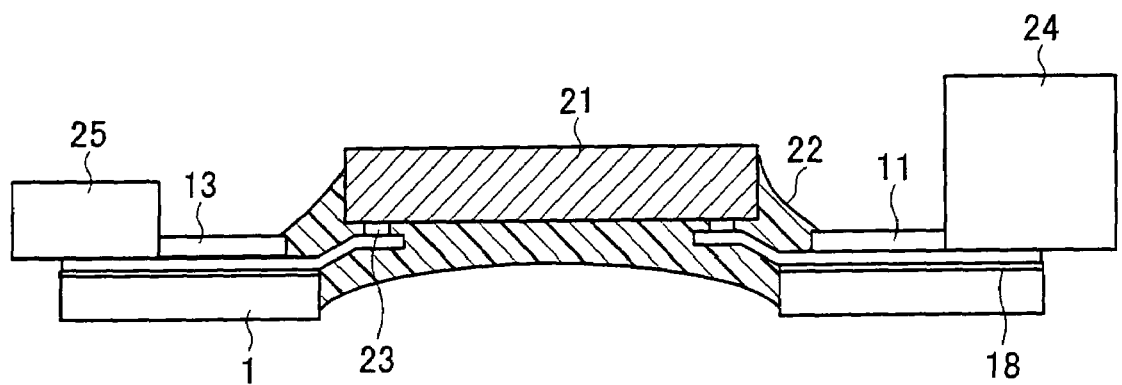
FIG. 8 is a cross-sectional view showing a semiconductor module device according to an embodiment of the present invention, corresponding to the embodiment of FIG. 6.

FIGS. 1 to 4 show embodiments of a COF tape carrier, a TCP tape carrier, and a semiconductor device according to the present invention, and FIGS. 5 to 8 show cross-sectional views of a COF semiconductor device, a TCP semiconductor device, and a module.

A tape carrier 100 used in the subject COF includes an insulative tape 1 as a base material, which is a flexible polyimide-type thin film 15 to 40 μm in thickness, and can be freely folded. The insulative tape 1 has a 8 to 18 μm thick copper foil or sputtered copper (wire pattern) laminated thereon by casting, sputtering (metalization technology) or the like.

A tape carrier 200 used in the subject TCP includes a polyimide insulative tape 1 on which a copper foil is laminated through an adhesive 18. The insulative tape 1 is provided with opening sections 16 in advance on a portion where the semiconductor element 21 is supposed to be mounted. Wire patterns 11 are protruded like cantilevers, and therefore their thickness are set to 18 μm or greater. A slit 17 is formed in advance in a fold-portion to be folded after the resulting semiconductor device is mounted to the liquid crystal panel or the like.

In both COF and TCP, the surface of the wire pattern 11 is coated with tin or gold. To give an insulative property, a solder resist 13 is applied to a junction between the wire patterns 11 and the semiconductor element 21, and a pattern exposing section except for an external connection section 12. The solder resist 13 is not applied to a mounting region 15 where the semiconductor element 21 is to be mounted, and a solder resist opening section 14 is formed instead. The coating layer is not illustrated in the figure.

In both COF and TCP, the insulative tape 1 of the thin film often has carriage-purpose openings called sprocket holes 2 which are formed at a 4.75 mm interval, and the tape pitch, which corresponds to the outer shape of the product, is generally set to a pitch of an integral multiple of that of the sprocket holes 2. The tape is carried through the facilities of the production process on the basis of 1-pitch of the sprocket holes 2. As a result, the part corresponding to the outer dimension pitch (an integral multiple) of a product is moved for each manufacturing step (in a step of processing/carrying a single device).

The semiconductor element 21 is thereon provided with a protruding electrode called a bump 23. In a COF, the bump 23 is formed on the surface of the insulative tape 1. In a TCP, the opening section 16 is formed in advance by penetrating through the tape on a portion of the insulative tape 1 where the semiconductor element 21 is to be mounted, and the bump 23 is bonded/mounted to the wire patterns 11 which are protruded like cantilevers. In this way, each wire of the wire patterns 11 is conducted to a bump 23 of a corresponding terminal of the semiconductor element 21. In a COF, the gap between the semiconductor element 21 and the tape carrier 100 which is generated after the semiconductor element 21 is bonded and mounted is sealed by a resin 22 injected thereto. In a TCP, the surface of the semiconductor element 21 is sealed by a resin 22 applied thereon after the semiconductor element 21 is bonded and mounted. An external connection section 12 of each wire pattern 11 is conducted to a liquid crystal panel 24, a printed circuit-board 25 or the like.

In the tape carriers for COF and TCP (100, 200) according to the present invention, the wire patterns 11 are conducted to the semiconductor element 21, and they are sealed by an insulative resin 22. Further, the outer dimension of the COF semiconductor device or a TCP semiconductor device in the carriage direction of the insulative tape 1 is greater than an integral multiple=4 (4 times) but not more than an integral multiple=4+½ (half pitch) (4+½ times) of the pitch (4.75 mm) of the sprocket holes 2 by which the insulative tape is carried. Though the tape pitch of the insulative tape to be a semiconductor device is generally set to an integral multiple=4+1=5 (5 times), this embodiment sets the tape pitch of a COF semiconductor device or a TCP semiconductor device to a 4+½=4.5 pitch. With this arrangement, the present embodiment reduces an unformed region (unnecessary region) of the insulative tape 1 which is irrelevant to the outer dimension of the COF semiconductor device or the TCP semiconductor device, thereby reducing material cost.

FIGS. 15 to 18 show conventional COF and TCP tape carriers (500, 600).

In the conventional COF and TCP tape carriers (500, 600), even when the outer dimension of the COF semiconductor device or a TCP semiconductor device in the carriage direction of the insulative tape 501 is greater than an integral multiple 4 of the pitch (4.75 mm) of the sprocket hole 2 by which the insulative tape 501 is carried, and not more than an integral multiple 4+½ pitch (half pitch), the tape pitch is still set to an integral multiple 4+1=5 pitch. In this structure, the tape contains an unformed region (unnecessary region) 503 of the insulative tape 501 which is irrelevant to the outer dimension of the COF semiconductor device or the TCP semiconductor device. Such an unformed region causes wastes of material/processing cost, manufacturing performance, or the like.

In the tape carriers (100, 200) for a COF or TCP semiconductor device as embodiments of the present invention, the unformed region (unnecessary region) of the insulative tape 1 which is irrelevant to the outer dimension of the COF semiconductor device or the TCP semiconductor device is cut. Therefore, the conventional problems of wastes of material/processing cost, manufacturing performance, or the like in the tape carriers (500, 600) for a conventional COF or TCP semiconductor device due to an increase in tape pitch can be solved, and material cost of a tape carrier for a COF or TCP semiconductor device can be reduced to about 90% of that for the conventional structure (set to 5 pitch on average).

Figure 19:
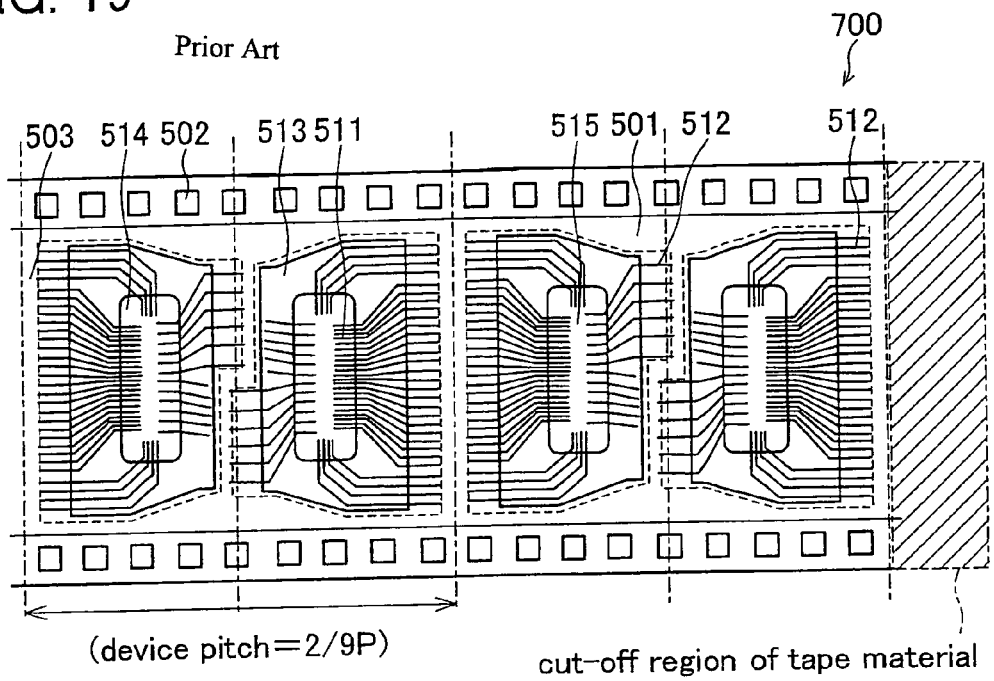
FIG. 19 is a plan view showing another conventional tape carrier for COF semiconductor device (before mounting semiconductor element).

FIG. 19 shows a tape carrier 700 for COP as another conventional example.

In the tape carrier 700 for a conventional COF, the external connection sections 512 are oppositely provided so as to reduce the unformed region 503, thereby reducing the tape pitch of the tape carrier 700. Such minimization in tape pitch of the tape carrier 700 by oppositely disposing the external connection sections 512 may not always useful for various COFs of different shapes, that is, the directions of the components on the tape carrier 700 have to be changed for each type of COF according to its shape.

Moreover, since the products are oriented to plural different directions in the foregoing layout, the manufacturing is required to be carried out with switching operations for changing the directions of the respective components when they are mounted to the tape carrier 700, according to the disposition direction of the COF. To meet this requirement, reduction in tape pitch of the tape carrier 700 and simplification of manufacturing process both need to be taken into account in the designing.

In contrast to such a conventional structure, the present invention does not require designing of the disposition direction of the components on the tape carrier according to the shape of COF.

Embodiment 2

Figure 9:
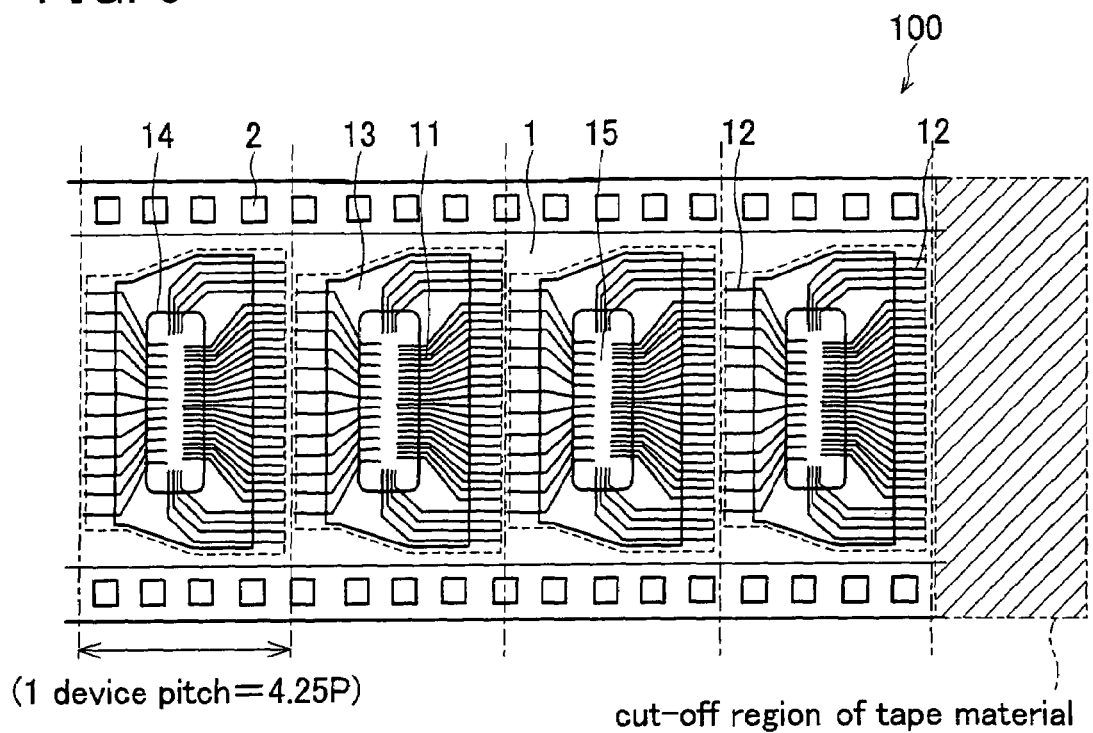
FIG. 9 is a plan view showing a tape carrier for COF semiconductor device (before mounting semiconductor element), according to still another embodiment of the present invention.
Figure 10:
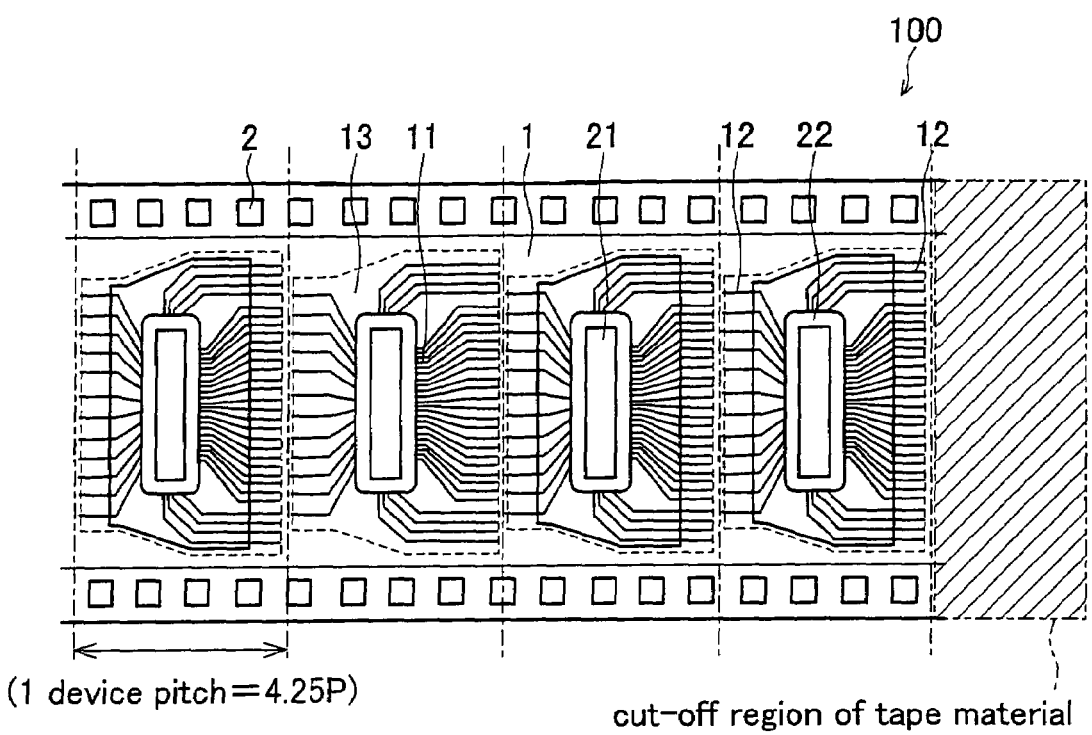
FIG. 10 is a plan view showing the tape carrier of FIG. 9 on which a semiconductor element is mounted (semiconductor device), according to the embodiment of FIG. 9 of the present invention.

FIGS. 9 and 10 show a tape carrier 100 for a COF, and a semiconductor device, as embodiments of the present invention.

In the tape carrier 100 for a COF as an embodiment of the present invention, the outer dimension of the COF semiconductor device in the carriage direction of the insulative tape 1 is greater than an integral multiple=4 (4 times) but not more than an integral multiple=4+¼ (4+¼ times) of the pitch (4.75 mm) of the sprocket holes 2 by which the insulative tape is carried. By setting this range of pitch=an integral multiple 4+¼ (=4.25 times) to the insulative tape 1 of a COF semiconductor device which usually have a pitch=an integral multiple 4+1=5 (5 times), the present embodiment reduces the unformed region (unnecessary region) of the insulative tape 1 which is irrelevant to the outer dimension of the COF semiconductor device. Therefore, the problems of wastes of material/processing cost, manufacturing performance, or the like of the tape carriers (500, 600) for a conventional COF semiconductor device due to an increase in tape pitch can be eliminated, and material cost of a tape carrier for a COF semiconductor device can be reduced to about 85% of that for the conventional COF or TCP tape carrier (5 pitch on average).

Embodiment 3

Figure 11:
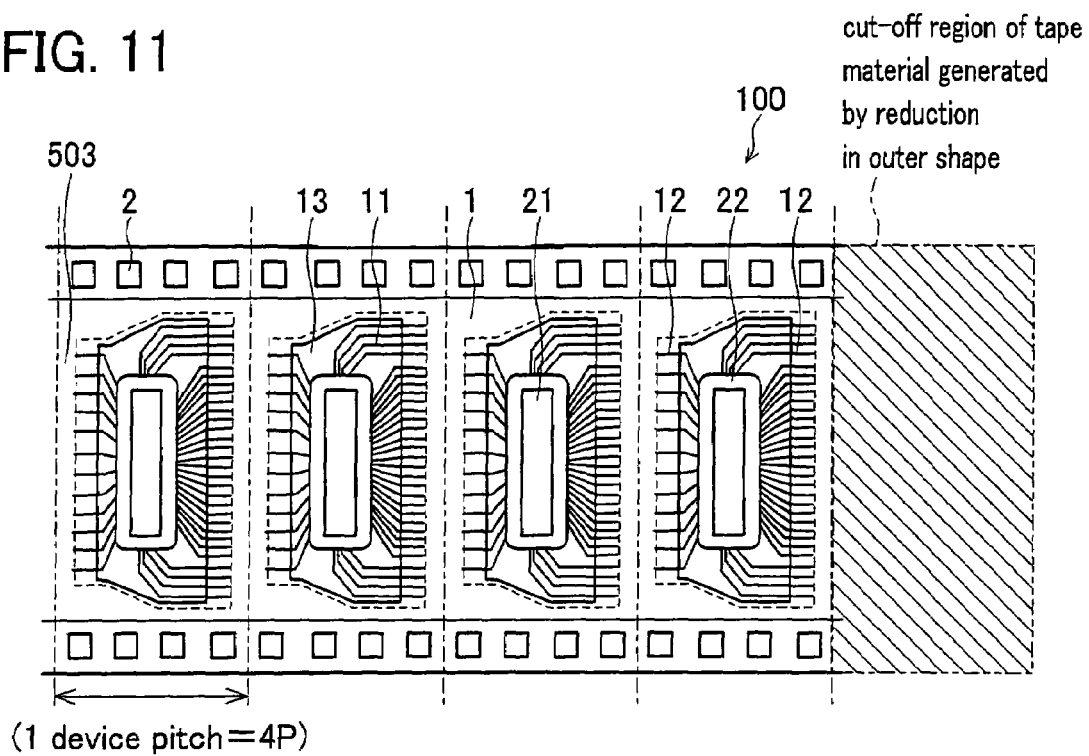
FIG. 11 is a plan view showing a COF semiconductor device according to yet another embodiment of the present invention.
Figure 11:
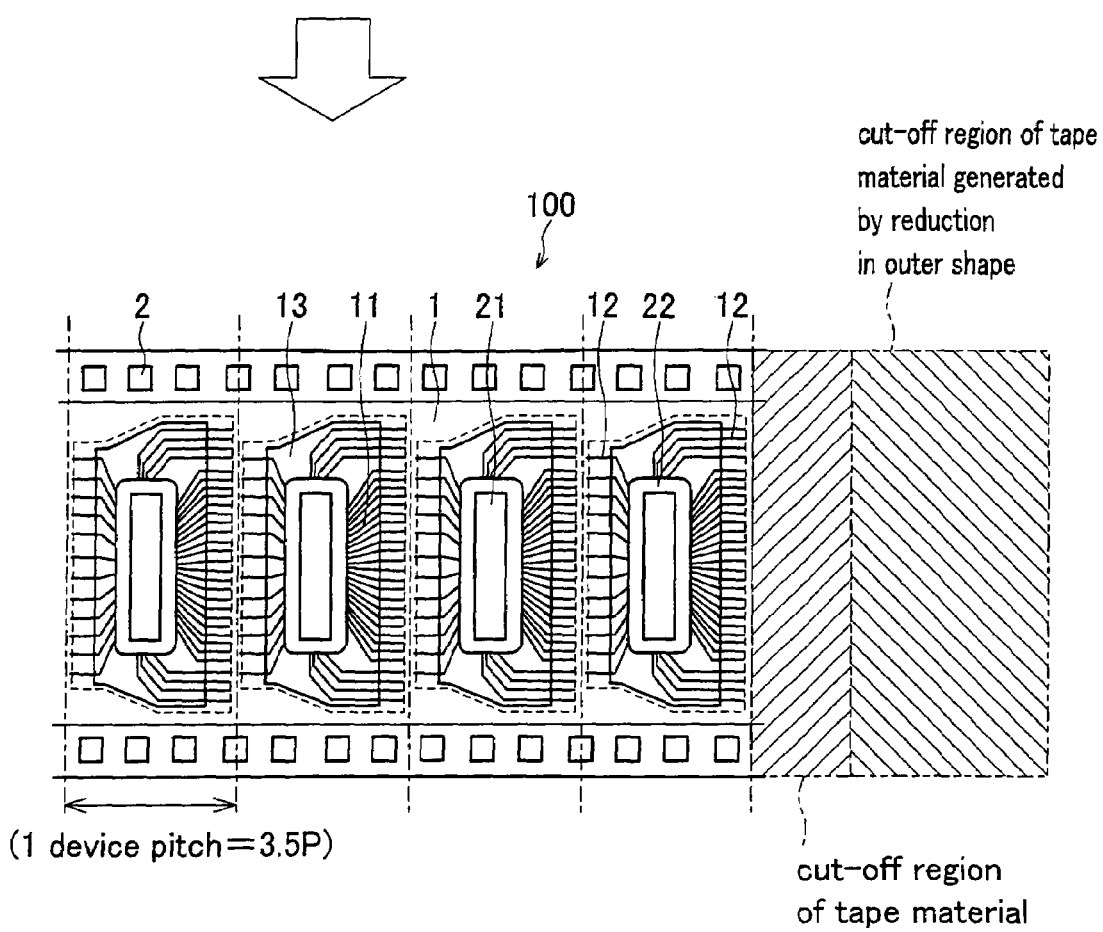

FIG. 11 shows a COF semiconductor device according to an embodiment of the present invention.

In the present embodiment, the outer dimension of a COF semiconductor device in the carriage direction of the insulative tape 1 is reduced in a design process of the wire patterns 11. As with Embodiment 1, the present embodiment also carries out reduction to ½ pitch (half pitch) at the same time, and sets the tape pitch of the COF semiconductor device to 3+½=3.5 pitch.

The reduction of outer dimension may be performed by decreasing the pitch between wires, by changing the layout of wire patterns, or by changing the outer shape according to user specifications.

The tape carrier 100 for a COP according to the present embodiment ensures an effect greater than that given by the tape carrier 100 of Embodiment 1 (the material cost is reduced to about 70%).

Embodiment 4

Figure 12:
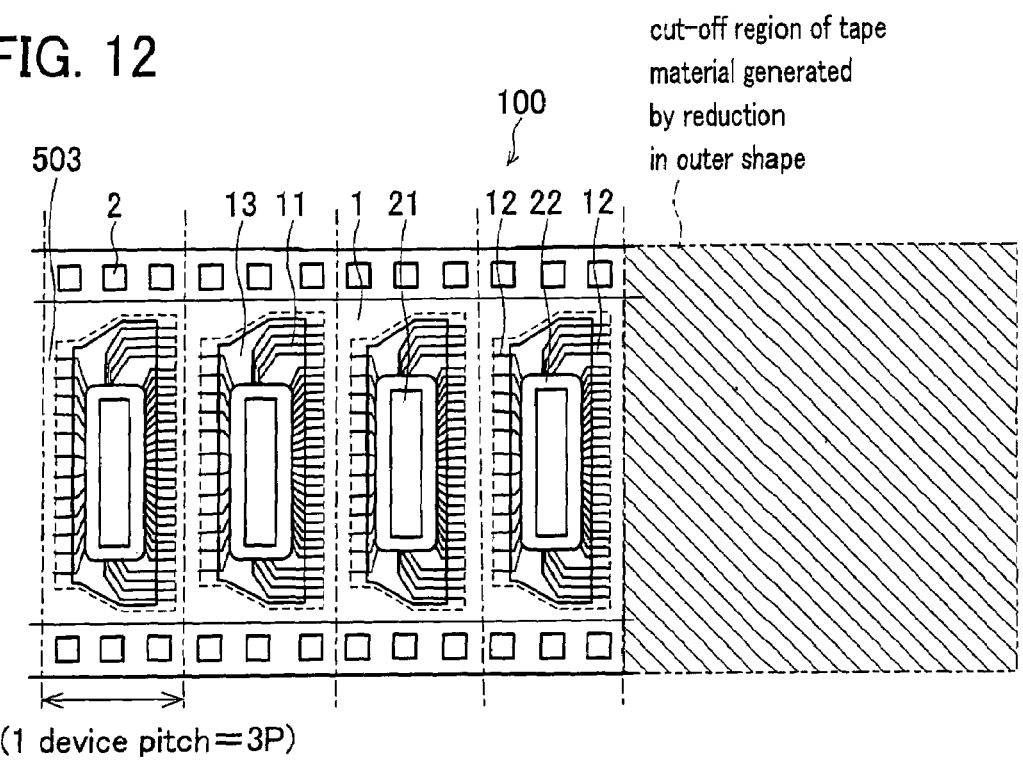
FIG. 12 is a plan view showing a COF semiconductor device according to still another embodiment of the present invention.
Figure 12:
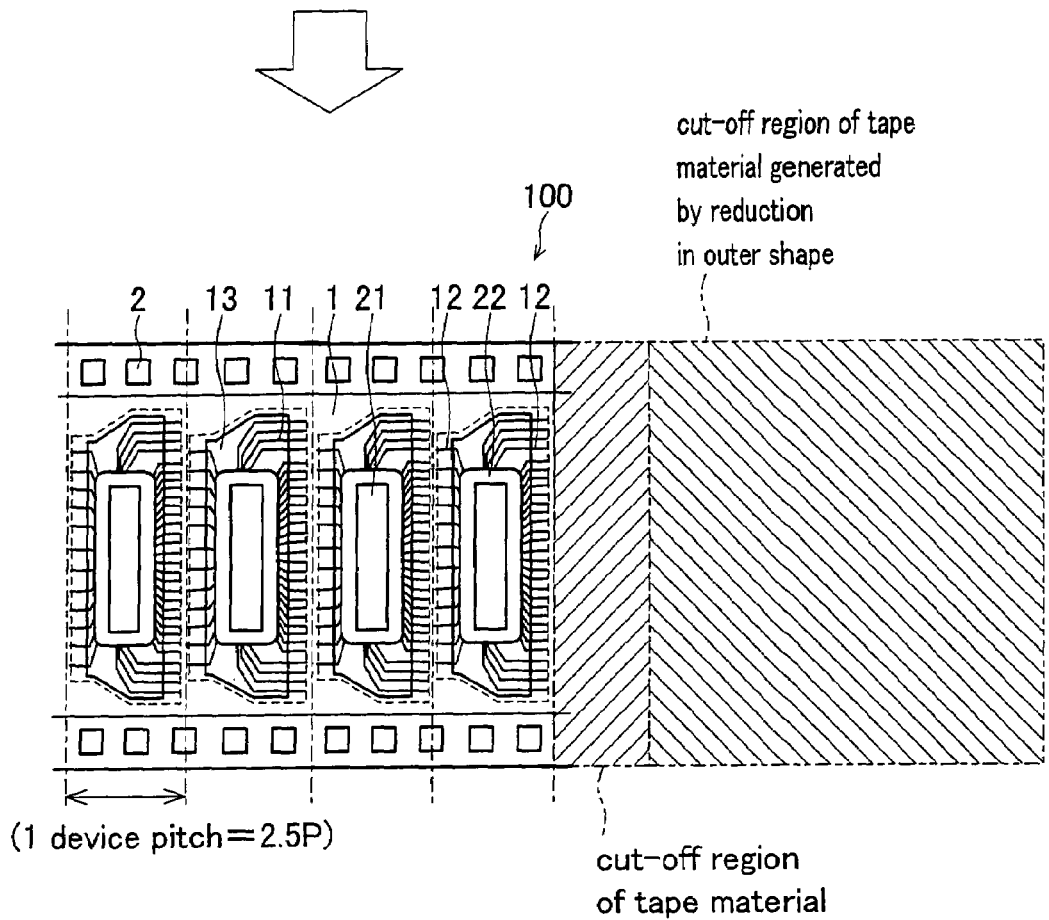

FIG. 12 shows a COF semiconductor device as an embodiment of the present invention.

As with Embodiment 3, in the present embodiment, the outer dimension of a COF semiconductor device in the carriage direction of the insulative tape 1 is reduced in a design process of the wire patterns 11. The reduction of the outer dimension of the COF semiconductor device in the carriage direction of the insulative tape 1 in the present embodiment is greater than Embodiment 3. As with Embodiments 1 and 3, the present embodiment also carries out reduction to ½ pitch (half pitch) at the same time, and sets the tape pitch of the COF semiconductor device to 2+½=2.5 pitch.

The tape carrier 100 for a COF according to the present embodiment ensures an effect greater than that given by the tape carrier 100 of Embodiment 1 and 3 (the material cost is reduced to 50%).

Embodiment 5

Figure 13:
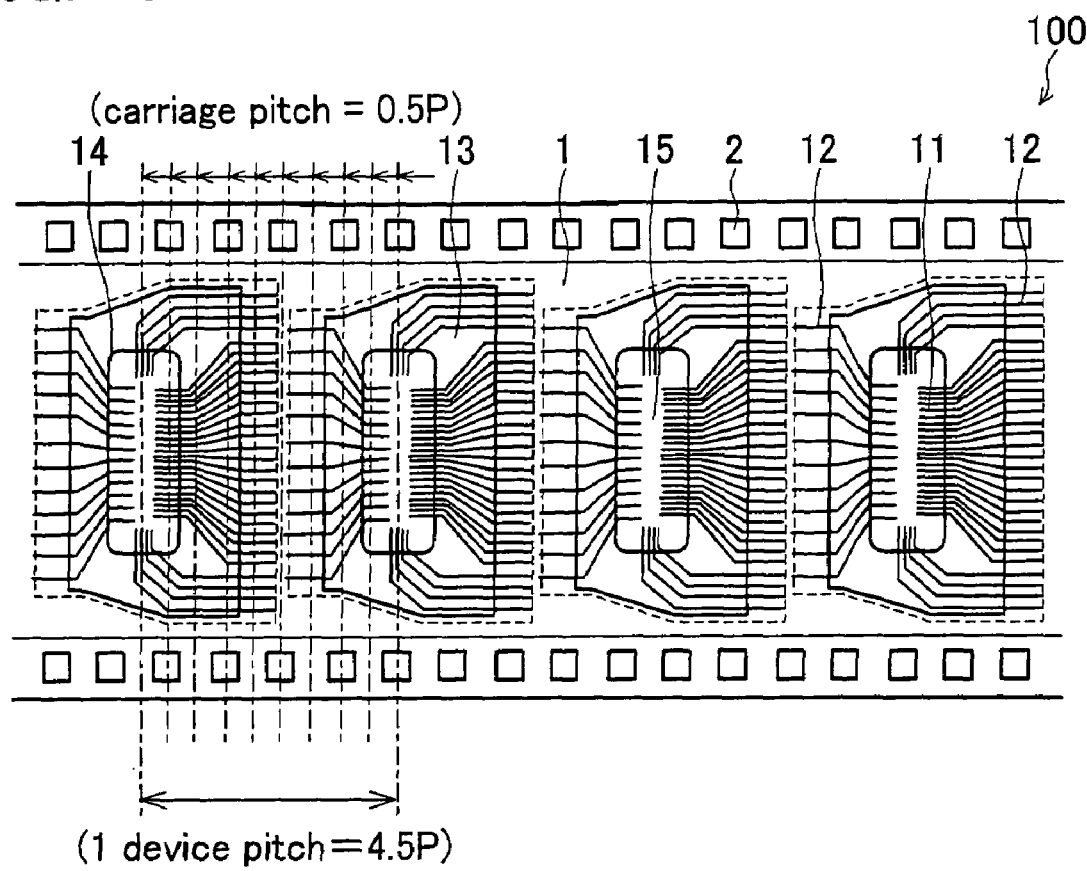
FIG. 13 is a plan view showing a semiconductor element mounting step according to an embodiment of the present invention.

FIG. 13 shows a manufacturing step (semiconductor element mounting step) for a COF semiconductor device as an embodiment of the present invention.

Figure 20:
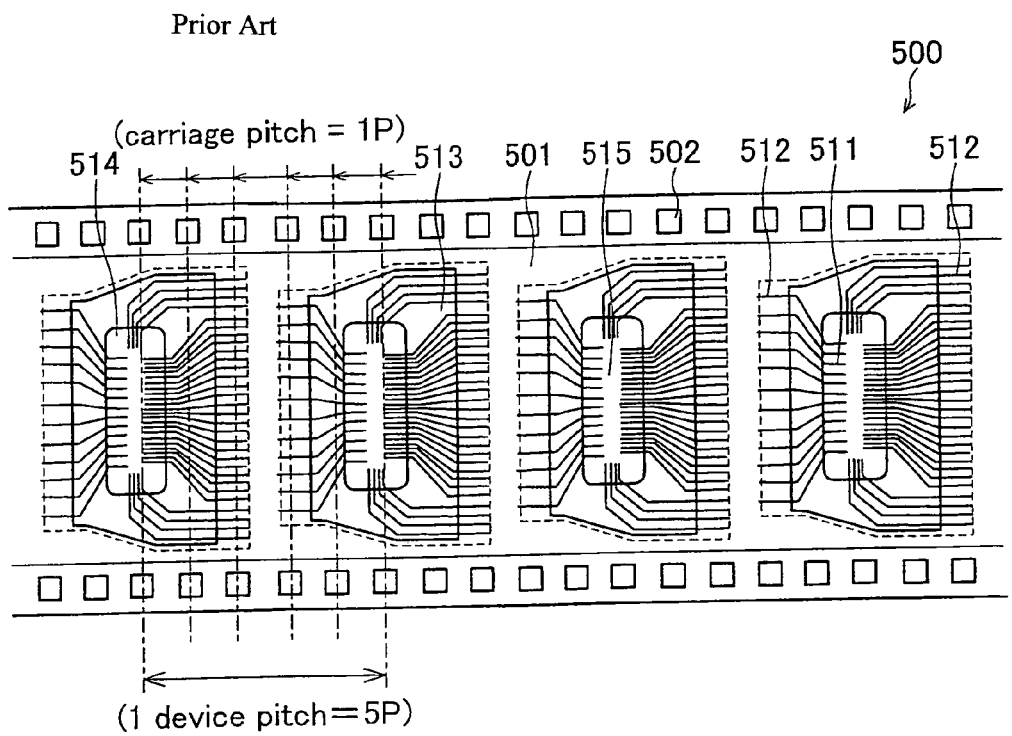
FIG. 20 is a plan view showing a mounting step of a conventional semiconductor element.

In the conventional manufacturing step for a COF semiconductor device, the carriage pitch of the production apparatus is set to 1 pitch as shown in FIG. 20, and the tape pitch of the COF semiconductor device is set to an integral multiple. For example, the pitch in production of a single device is set to 1 pitch×5=5 pitch.

In the manufacturing step (semiconductor element mounting step) for a COF semiconductor device according to the present invention, the carriage pitch of the production device is set to ½ pitch (half pitch) by modification of software or carriage mechanism, and the tape pitch of the COF semiconductor device is set to an integral multiple=4+½ (4+½ times)=4.5 pitch. For example, the pitch in production of a single device is set to 0.5 pitch×9=4.5 pitch.

More specifically, the tape pitch of a single device according to the semiconductor device tape carrier of the present embodiment is an integral multiple X+a decimal Y=4+0.5=4.5 times of the pitch interval of the sprocket holes. The pitch in the manufacturing step (semiconductor element mounting step) for the semiconductor device is also set to 4.5 pitch, but several pitches may be applied to the decimal Z (0<z<1, an integral multiple of Z=0.05), which is the carriage pitch in the manufacturing step, such as 0.05×5=0.25Pitch, 0.05×10=0.5 Pitch, or 0.05×30=1.5 Pitch.

The manufacturing step (semiconductor element mounting step) for a COF semiconductor device according to the present embodiment corresponds to the manufacturing step for a tape carrier 100 for a COF according to Embodiment 1, but the described manner (semiconductor element mounting step) is also useful for Embodiment 3 and Embodiment 4.

Embodiment 6

Figure 14:
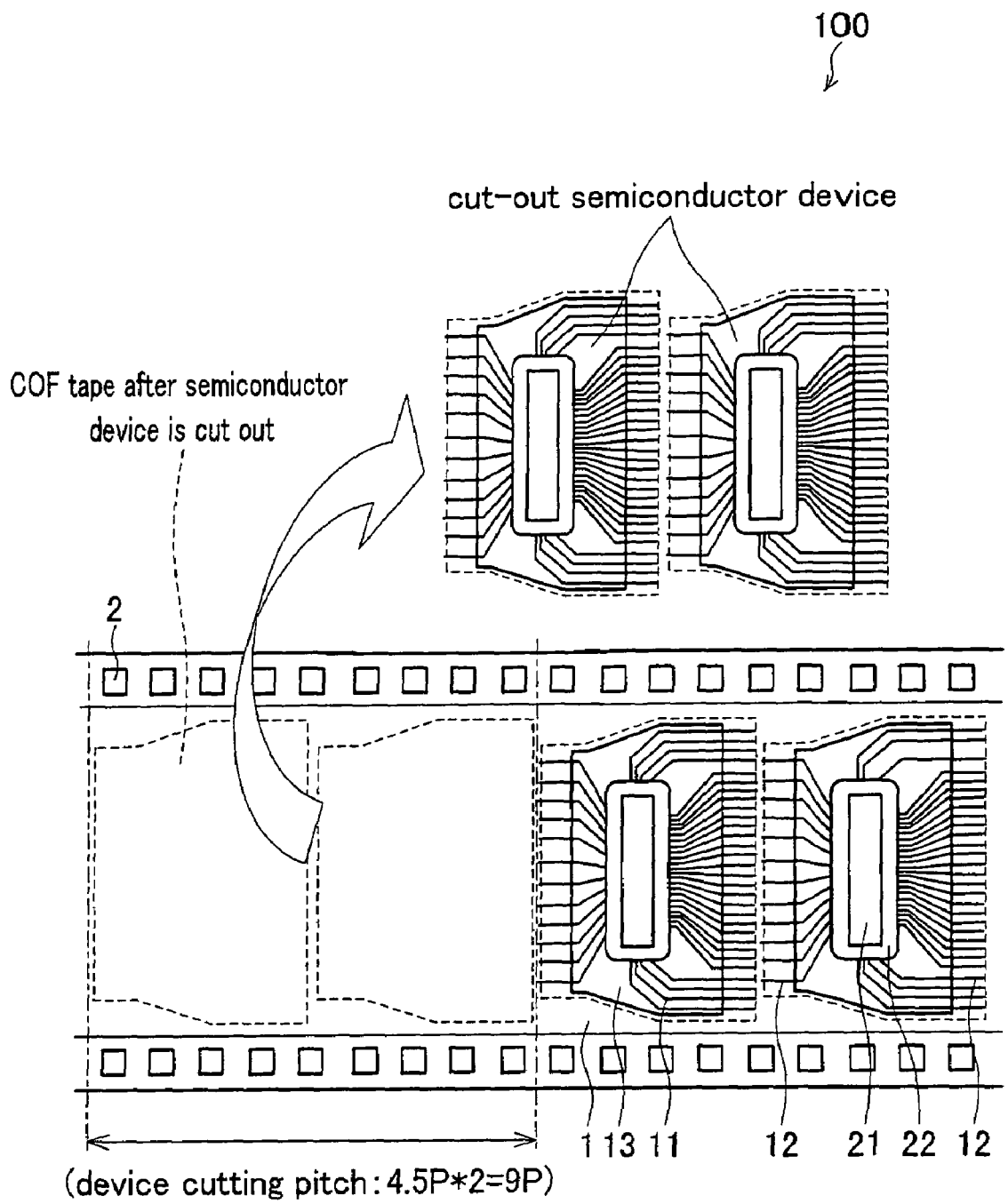
FIG. 14 is a plan view showing a cutting-out step of a COF semiconductor device according to an embodiment of the present invention.
Figure 15:
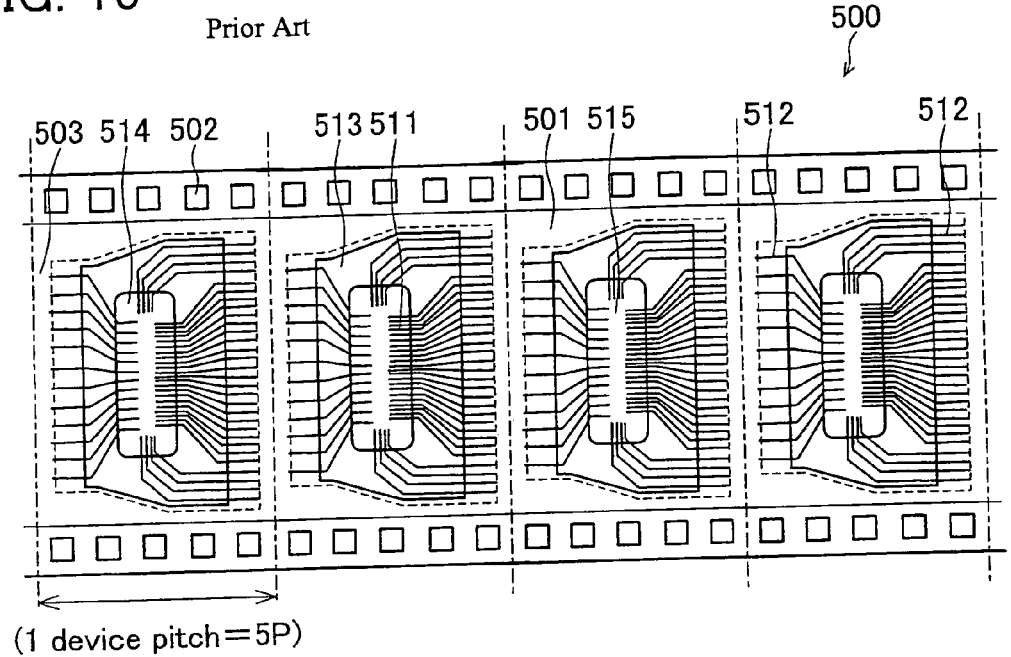
FIG. 15 is a plan view showing a conventional tape carrier for COF semiconductor device (before mounting semiconductor element).
Figure 16:
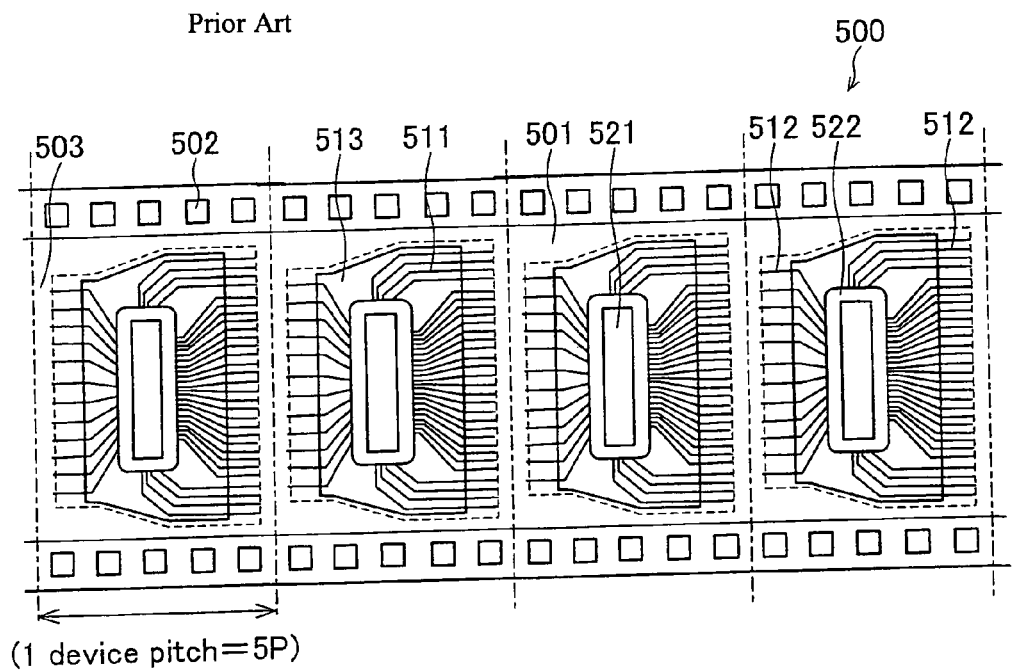
FIG. 16 is a plan view showing a conventional COF semiconductor device.
Figure 17:
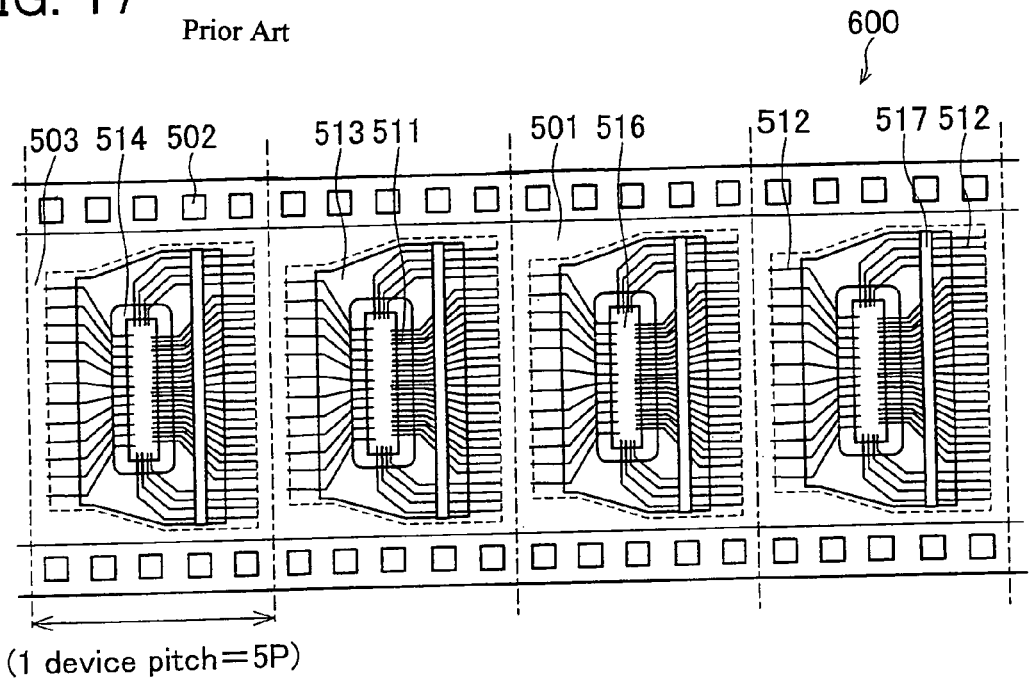
FIG. 17 is a plan view showing a conventional tape carrier for TCP semiconductor device (before mounting semiconductor element).
Figure 18:
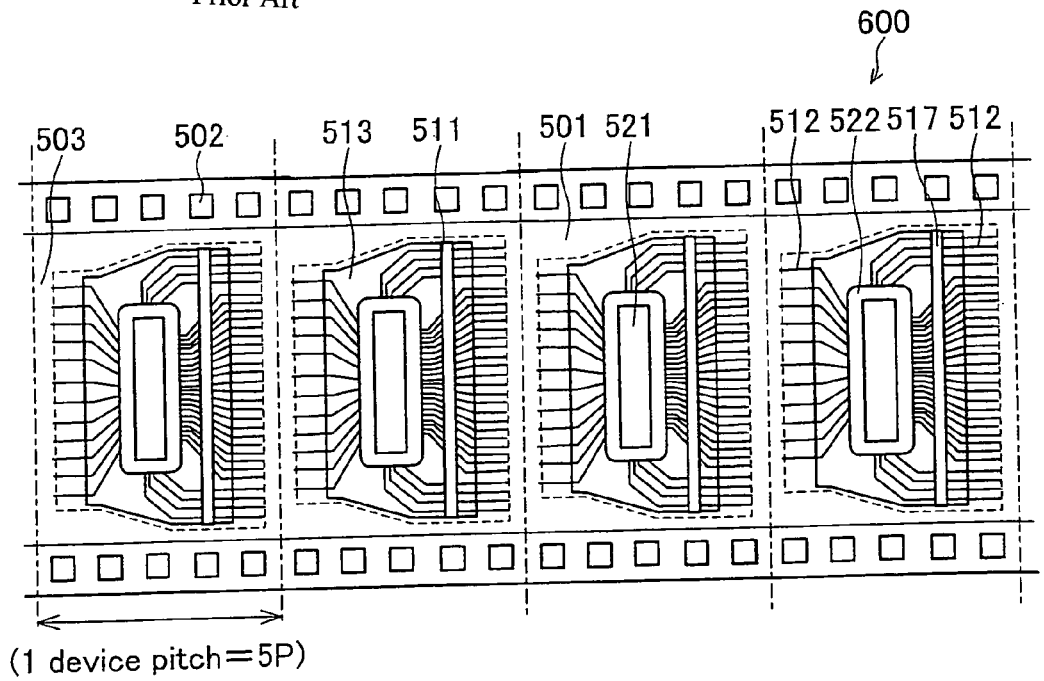
FIG. 18 is a plan view showing a conventional TCP semiconductor device.

FIG. 14 shows a manufacturing step (semiconductor device cutting-out step) for a COF semiconductor device as an embodiment of the present invention.

Figure 21:
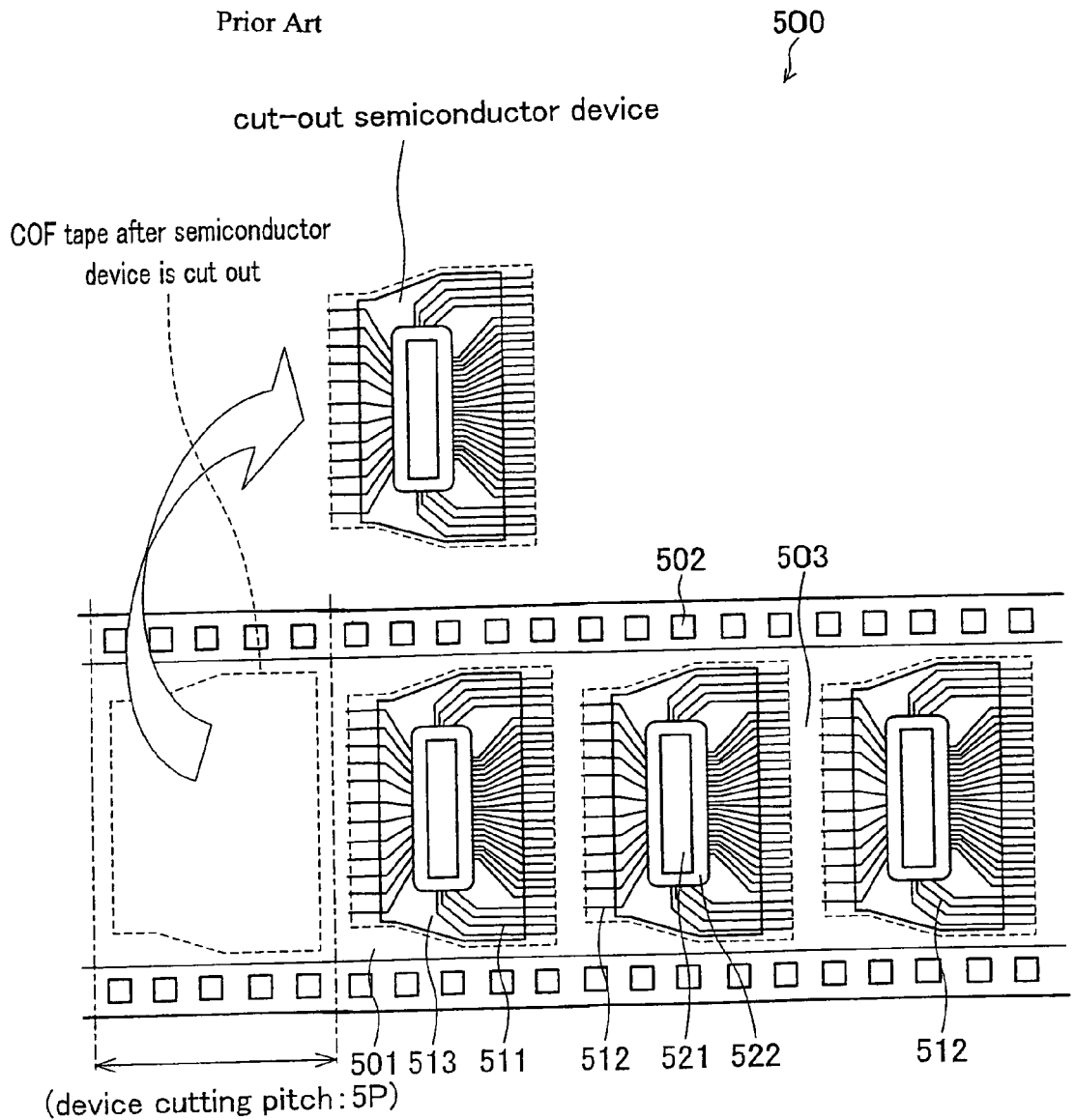
FIG. 21 is a plan view showing a cutting-out step of a conventional COF semiconductor device.

In the conventional manufacturing step for a COF semiconductor device, the COF semiconductor devices are cut out of the insulative tape 1 one by one as shown in FIG. 21.

In the manufacturing step for a COF semiconductor element according to the present invention, the processing pitch for manufacturing the COF semiconductor devices is set to an integral multiple so that a plurality of COF semiconductor devices is processed at once. In the step of cutting the COF semiconductor devices out of the insulative tape 1, a plurality (two) of COF semiconductor devices is cut at once, and the cutting pitch is set to an integral multiple (9) of the pitch interval (4.75 mm) of the sprocket hole 2.

The manufacturing step (semiconductor device cutting-out step) for a COF semiconductor device according to the present embodiment corresponds to the manufacturing step for a tape carrier 100 for COF according to Embodiment 1, but the described manner is also useful for Embodiment 3 and Embodiment 4.

As described, in the case where the outer dimension of the product is greater than an integral multiple X (X=1,2,3,4,5, ... ) of the pitch of the sprocket holes and equal to or less than X+a decimal Y (0<Y<1) of the pitch of the sprocket holes (the tape pitch is generally set to a X+1 pitch in this case), in the present embodiment, the tape pitch can be reduced to a value of an integral multiple X+a decimal Y (0<Y<1) of the pitch of the sprocket holes. For example, in the case where 4 pitch+½ pitch (half pitch), 4+1=5 pitch is generally set, but reduction to 4+0.5=4.5 pitch can be set. This easily ensures 10% of reduction. If the outer dimension of the product can be reduced, further reduction becomes possible.

However, it is necessary to use the pitch for product, that is the integral multiple X+a decimal Y (0<Y<1) pitch, also in the manufacturing step or the product cutting process for a COF or TCP. To set the pitch for production facility to a decimal Z pitch (0<z<1, Z=an integral multiple of 0.05), for example, in the case where 4+0.5=4.5 pitch, the carriage pitch of 0.5 can be easily realized by changing the software of production facility or the carriage mechanism, and also by cutting a plurality of products out of the insulative tape at once.

SUMMARY OF EMBODIMENTS

In order to solve the foregoing problems, a tape carrier for a COF or TCP semiconductor device and a manufacturing method for a semiconductor device according to the present embodiment provide an effect of reducing an unformed region (unnecessary region) not included in the outer dimension of the COF or TCP semiconductor device by the following arrangement, thereby reducing material cost. More specifically, the present invention arranges a semiconductor device tape carrier is formed of an insulative tape of a thin film, which becomes a COF or TCP semiconductor device by conducting a plurality of wire patterns on its surface to a protruding electrode of a semiconductor element and being sealed by an insulative resin such that: an outer dimension of the COF or TCP semiconductor device in a carriage direction of the insulative tape is greater than an integral multiple X of a pitch interval (4.75 mm) of sprocket holes, which are openings formed to carry the insulative tape, and not more than: the integral multiple X+a decimal Y (0<Y<1); and a tape pitch for a COF or TCP semiconductor device is set to an integral multiple X+a decimal Y (0<Y<1) so as to reduce an unformed region of the insulative tape which is irrelevant to the outer dimension of the semiconductor device, unlike the tape pitch=an integral multiple X+1 of a general insulative tape carrier to be a COF or TCP semiconductor device. Moreover, the present embodiment is also arranged such that the manufacturing method carries out assembly processes such as semiconductor element mounting, resin sealing, or test, using a decimal Z carriage pitch (0<z<1, Z=an integral multiple of 0.05), and produces the COF or TCP semiconductor device with the tape pitch of: the integral multiple X+the decimal Y (0<Y<1); software or a carriage mechanism is modified to set a carriage pitch of a production facility to decimal Z (0<z<1, Z=an integral multiple of 0.05); the manufacturing method simultaneously processes a plurality of the semiconductor devices in the assembly processes such as semiconductor element mounting, resin sealing, or test, and a product pitch of the semiconductor device is set to an integral multiple of the pitch interval of sprocket holes; a production facility having a plurality of processing mechanisms for processing the semiconductor device is used to simultaneously process a plurality of the semiconductor devices; and the manufacturing method carries out a cutting-out step of the semiconductor device in which a plurality of the semiconductor devices are simultaneously cut out of the insulative tape into products, and a product pitch in the cutting-out process of the semiconductor devices are set to an integral multiple of the pitch interval of the sprocket holes.

The tape carrier for a COF or TCP semiconductor device and the manufacturing method for a semiconductor device according to the present embodiment differs from the tape carrier for a COF or TCP semiconductor device and the manufacturing method for a semiconductor device according to the conventional art in that: a tape pitch for a COF or TCP semiconductor device is set to an integral multiple X+a decimal Y (0<Y<1) so as to reduce an unformed region of the insulative tape which is irrelevant to the outer dimension of the semiconductor device; the manufacturing method carries out assembly processes such as semiconductor element mounting, resin sealing, or test, using a decimal Z carriage pitch (0<z<1, Z=an integral multiple of 0.05), and produces the COF or TCP semiconductor device with the tape pitch of: the integral multiple X+the decimal Y (0<Y<1); software or a carriage mechanism is modified to set a carriage pitch of a production facility to decimal Z (0<z<1, Z=an integer of 0.05); the manufacturing method simultaneously processes a plurality of the semiconductor devices in the assembly processes such as semiconductor element mounting, resin sealing, or test, and a product pitch of the semiconductor device is set to an integral multiple of the pitch interval of sprocket holes; a production facility having a plurality of processing mechanisms for processing the semiconductor device is used to simultaneously process a plurality of the semiconductor devices; and the manufacturing method carries out a cutting-out step of the semiconductor device in which a plurality of the semiconductor devices are simultaneously cut out of the insulative tape into products, and a product pitch in the cutting-out process of the semiconductor devices are set to an integral multiple of the pitch interval of the sprocket holes. Therefore, apart from partial change in software or carriage mechanism, the conventional facility and method can be used.

With this arrangement in which the tape pitch for a COF or TCP semiconductor device is set to an integral multiple X+a decimal Y (0<Y<1) so as to reduce an unformed region of the insulative tape which is irrelevant to the outer dimension of the semiconductor device and the manufacturing method carries out assembly processes such as semiconductor element mounting, resin sealing, or test, using a decimal Z carriage pitch (0<z<1, Z=an integral multiple of 0.05), and produces the COF or TCP semiconductor device with the tape pitch of: the integral multiple X+the decimal Y (0<Y<1); software or a carriage mechanism is modified to set a carriage pitch of a production facility to decimal Z (0<z<1, Z=an integral multiple of 0.05); the manufacturing method simultaneously processes a plurality of the semiconductor devices in the assembly processes such as semiconductor element mounting, resin sealing, or test, and a product pitch of the semiconductor device is set to an integral multiple of the pitch interval of sprocket holes; a production facility having a plurality of processing mechanisms for processing the semiconductor device is used to simultaneously process a plurality of the semiconductor devices; and the manufacturing method carries out a cutting-out step of the semiconductor device in which a plurality of the semiconductor devices are simultaneously cut out of the insulative tape into products, and a product pitch in the cutting-out process of the semiconductor devices are set to an integral multiple of the pitch interval of the sprocket holes, the tape carrier for a COF or TCP semiconductor device and the manufacturing method for a semiconductor device according to the present embodiment can cut the unformed region (unnecessary region) not included in the outer shape of a COF and TCP product, thereby achieving about 10% reduction in material cost, compared with the tape carrier for a COF or TCP semiconductor device and the manufacturing method for a semiconductor device according to the conventional art.

As described, the present embodiment arranges the manufacturing method for a semiconductor device having a semiconductor element bonded/mounted to a flexible wiring substrate such that the tape pitch of the semiconductor device is set to the integral multiple X+a decimal Y (0<Y<1) according to the outer dimension of the semiconductor device, thereby reducing an unformed region (unnecessary region) of the insulative tape which is irrelevant to the outer dimension of the semiconductor device. With this advantage, the present embodiment is applicable to a field of manufacturing of semiconductor devices formed of tape materials, such as the COF or TCP semiconductor devices, or its components, and can be further applicable to a field related to manufacturing of a product specified in length using a roll-type material.

As described, the tape carrier for a COF or TCP semiconductor device according to the present embodiment is arranged such that an outer dimension of the semiconductor device in a carriage direction of the insulative tape is greater than an integral multiple X (X=1, 2, 3, 4, 5, . . . ) of a pitch interval of sprocket holes, which are openings formed to carry the insulative tape, and not more than: the integral multiple X+a decimal Y (0<Y<1). By setting this range of pitch=an integral multiple X+a decimal Y (0<Y<1) to the insulative tape 1 of a COF semiconductor device which usually have a pitch=an integral multiple X+1, the present embodiment reduces the unformed region of the insulative tape 1 which is irrelevant to the outer dimension of the semiconductor device.

As described, the manufacturing method for a COF or TCP semiconductor device according to the present embodiment carries out assembly processes such as semiconductor element mounting, resin sealing, or test, using a decimal Z carriage pitch (0<z<1, Z=an integral multiple of 0.05), and produces the semiconductor device with the tape pitch of: the integral multiple X+the decimal Y (0<Y<1).

As described, the manufacturing method for a COF or TCP semiconductor device according to the present embodiment simultaneously processes a plurality of the semiconductor devices in the assembly processes such as semiconductor element mounting, resin sealing, or test, and a product pitch of the semiconductor device is set to an integral multiple of the pitch interval of sprocket holes.

The semiconductor device or the semiconductor module device according to the present embodiment is manufactured using the foregoing tape carrier for a COF or TCP semiconductor device, or the foregoing manufacturing method for a semiconductor device.

Therefore, in a tape carrier for a COF or TCP semiconductor device, the unformed region (unnecessary region) of the semiconductor device which is irrelevant to the outer dimension of the semiconductor device can be reduced. In this way, the present embodiment provides an effect of producing a semiconductor device tape carrier, a manufacturing method for a semiconductor device, a semiconductor device, and a semiconductor module device with about 10% reduction in material cost.

More specifically, with the foregoing arrangement in which The tape carrier for a COF or TCP semiconductor device and the manufacturing method for a semiconductor device according to the present embodiment differs from the tape carrier for a COF or TCP semiconductor device and the manufacturing method for a semiconductor device according to the conventional art in that: a tape pitch for a COF or TCP semiconductor device is set to an integral multiple X+a decimal Y (0<Y<1) so as to reduce an unformed region of the insulative tape which is irrelevant to the outer dimension of the semiconductor device; the manufacturing method carries out assembly processes such as semiconductor element mounting, resin sealing, or test, using a decimal Z carriage pitch (0<z<1, Z=an integral multiple of 0.05), and produces the COF or TCP semiconductor device with the tape pitch of: the integral multiple X+the decimal Y (0<Y<1); software or a carriage mechanism is modified as required to set a carriage pitch of a production facility to decimal Z (0<z<1, Z=an integral multiple of 0.05); the manufacturing method simultaneously processes a plurality of the semiconductor devices in the assembly processes such as semiconductor element mounting, resin sealing, or test, and a product pitch of the semiconductor device is set to an integral multiple of the pitch interval of sprocket holes; a production facility having a plurality of processing mechanisms for processing the semiconductor device is used to simultaneously process a plurality of the semiconductor devices; and the manufacturing method carries out a cutting-out step of the semiconductor device in which a plurality of the semiconductor devices are simultaneously cut out of the insulative tape into products, and a outer shape or carriage pitch in the cutting-out process of the semiconductor devices are set to an integral multiple of the pitch interval of the sprocket holes, the tape carrier for a COF or TCP semiconductor device and the manufacturing method for a semiconductor device according to the present embodiment can cut the unformed region (unnecessary region) not included in the outer shape of a COF and TCP product, thereby achieving about 10% reduction in material cost, compared with the tape carrier for a COF or TCP semiconductor device and the manufacturing method for a semiconductor device according to the conventional art.

Further, a tape carrier for a COF or TCP semiconductor device according to the present embodiment is preferably arranged so that, in a case where the outer dimension of the semiconductor device in the carriage direction of the insulative tape is reduced in a design process of the wire patterns, the setting of the decimal Y (0<Y<1) pitch is carried out in the same process so that the tape pitch for the COF or TCP semiconductor device tape carrier is set to: the integral multiple X+the decimal Y pitch (0<Y<1).

With this invention, an unformed region (unnecessary region) of the insulative tape which is irrelevant to the outer dimension of the semiconductor device can be reduced, and material cost can be reduced.

As described, the manufacturing method for a COF or TCP semiconductor device according to the present embodiment carries out assembly processes such as semiconductor element mounting, resin sealing, or test, using a decimal Z carriage pitch (0<z<1, Z=an integral multiple of 0.05), and produces the semiconductor device with the tape pitch of: the integral multiple X+the decimal Y (0<Y<1).

The present embodiment sets the carriage pitch of the production facility to a decimal Z pitch (0<z<1, Z=an integral multiple of 0.05) by appropriately modifying software or a carriage mechanism.

The manufacturing method for a COF or TCP semiconductor device according to the present embodiment may simultaneously process a plurality of the semiconductor devices in the assembly processes such as semiconductor element mounting, resin sealing, or test, and a product pitch of the semiconductor device is set to an integral multiple of the pitch interval of sprocket holes.

The manufacturing method may be carried out with a production facility having a plurality of the processing mechanisms for processing the semiconductor device so as to simultaneously process a plurality of the semiconductor devices.

The manufacturing method for a COF or TCP semiconductor device according to the present embodiment may carry out a cutting-out step of the semiconductor device in which a plurality of the semiconductor devices are simultaneously cut out of the insulative tape into products, and an outer dimension or a product pitch in the cutting-out process of the semiconductor devices are set to an integral multiple of the pitch interval of the sprocket holes T The method uses a single set of cutting dies to simultaneously cut out a plurality of the semiconductor devices.

With this invention, the carriage pitch in manufacturing a COF or TCP semiconductor device is set to a decimal Z pitch (0<z<1, Z=an integral multiple of 0.05), and the tape pitch of the tape carrier for a COF or TCP semiconductor device is set to an integral multiple X+a decimal Y (0<Y<1). In this manner, an unformed region (unnecessary region) of the insulative tape which is irrelevant to the outer dimension of the semiconductor device can be reduced, and material cost can be reduced.

With this invention, an unformed region (unnecessary region) of the insulative tape which is irrelevant to the outer dimension of the COF or TCP semiconductor device is reduced, and material cost for producing a semiconductor device or a semiconductor module device can be reduced.

A semiconductor device tape carrier according to the present embodiment comprises an insulative tape of a thin film on which a plurality of wire patterns is provided; a semiconductor element; and an insulative resin which seals the semiconductor element and the wire patterns under the semiconductor element in a state where the semiconductor element is conducted to the wire patterns, wherein: the sealed semiconductor element and the wire patterns conducted to each other form a semiconductor device, and a plurality of sprocket holes for carrying the insulative tape is formed at a predetermined interval in a longitudinal direction of the semiconductor device tape carrier, and in a case where an outer width of the semiconductor device in the longitudinal direction is greater than X times (X being a natural number) and not more than X+Y (0<Y<1) times of the predetermined interval of the sprocket holes, the wire patterns are provided at an interval of X+Y times of the predetermined interval of the sprocket holes.

The semiconductor device tape carrier according to the present embodiment may be arranged so that, in a case where an outer width of the semiconductor device in the longitudinal direction is greater than X times (X being a natural number) and not more than X+(½) times of the predetermined interval of the sprocket holes, the wire patterns are provided at an interval of X+(½) times of the predetermined interval of the sprocket holes.

The semiconductor device tape carrier according to the present embodiment may be arranged so that, in a case where an outer width of the semiconductor device in the longitudinal direction is greater than X times (X being a natural number) and not more than X+(¼) times of the predetermined interval of the sprocket holes, the wire patterns are provided at an interval of X+(¼) times of the predetermined interval of the sprocket holes.

The semiconductor device tape carrier according to the present embodiment is preferably arranged so that the semiconductor device is a COF or a TCP.

A manufacturing method for a semiconductor device according to the present embodiment produces a semiconductor device using the foregoing semiconductor device tape carrier.

A semiconductor device according to the present embodiment is produced using the foregoing semiconductor device tape carrier.

A semiconductor module device according to the present embodiment is produced using the foregoing semiconductor device.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A semiconductor device tape carrier formed of an insulative tape of a thin film, which becomes a semiconductor device by conducting a plurality of wire patterns on its surface to a protruding electrode of a semiconductor element and being sealed by an insulative resin, comprising:
   an outer dimension of the semiconductor device in a carriage direction of the insulative tape is greater than X times and not more than X+Y times of a pitch interval of sprocket holes, X being a natural number and Y being a decimal greater than 0 and less than 1, the sprocket holes being openings formed to carry the insulative tape; and
   a tape pitch for a single semiconductor device is set to X+Y times of the pitch interval of the sprocket holes so as to reduce an unformed region of the insulative tape which is irrelevant to the outer dimension of the semiconductor device.

2. A semiconductor device tape earner as set forth in claim 1, wherein the semiconductor device is a COF or a TCP.

3. A semiconductor device tape carrier as set forth in claim 2, wherein, in a case where the outer dimension of the semiconductor device in the carriage direction of the insulative tape is reduced in a design process of the wire patterns, the setting of the decimal Y pitch is carried out in the same process so that the tape pitch for the COF or TCP semiconductor device tape carrier is set to X+Y times of the pitch interval of the sprocket holes.

4. A semiconductor device tape carrier as set forth in claim 1, wherein the decimal Y is an integral multiple of 0.05.

5. A semiconductor device composed of a semiconductor device tape carrier formed of an insulative tape of a thin film, which becomes a semiconductor device by conducting a plurality of wire patterns on its surface to a protruding electrode of a semiconductor element and being sealed by an insulative resin, comprising:
   an outer dimension of the semiconductor device in a carriage direction of the insulative tape is greater than X times and not more than X+Y times of a pitch interval of sprocket holes, X being a natural number and Y being a decimal greater than 0 and less than 1, the sprocket holes being openings formed to carry the insulative tape; and
   a tape pitch for a single semiconductor device is set to X+Y times of the pitch interval of the sprocket holes so as to reduce an unformed region of the insulative tape which is irrelevant to the outer dimension of the semiconductor device.

6. A semiconductor module device made of a semiconductor device composed of a semiconductor device tape carrier formed of an insulative tape of a thin film, which becomes a semiconductor device by conducting a plurality of wire patterns on its surface to a protruding electrode of a semiconductor element and being sealed by an insulative resin, comprising:

an outer dimension of the semiconductor device in a carriage direction of the insulative tape is greater than X times and not more than X+Y times of a pitch interval of sprocket holes, X being a natural number and Y being a decimal greater than 0 and less than 1, the sprocket holes being openings formed to carry the insulative tape; and a tape pitch for a single semiconductor device is set to X+Y times of the pitch interval of the sprocket holes so as to reduce an unformed region of the insulative tape which is irrelevant to the outer dimension of the semiconductor device.

7. A semiconductor device tape carrier comprising:
an insulative tape of a thin film on which a plurality of wire patterns is provided;
a semiconductor element; and
an insulative resin which seals the semiconductor element and the wire patterns under the semiconductor element in a state where the semiconductor element is conducted to the wire patterns, wherein:
   the sealed semiconductor element and the wire patterns conducted to each other form a semiconductor device, and a plurality of sprocket holes for carrying the insulative tape is formed at a predetermined interval in a longitudinal direction of the semiconductor device tape carrier, and
   in a case where an outer width of the semiconductor device in the longitudinal direction is greater than X times and not greater than X+Y times of the predetermined interval of the sprocket holes, the wire patterns are provided at an interval of X+Y times of the predetermined interval of the sprocket holes, X being a natural number, Y being a decimal being greater than 0 and less than 1.

8. The semiconductor device tape carrier as set forth in claim 7, wherein, in a case where an outer width of the semiconductor device in the longitudinal direction is greater than X times and not greater than X+(½) times of the predetermined interval of the sprocket holes, the wire patterns are provided at an interval of X+(½) times of the predetermined interval of the sprocket holes.

9. The semiconductor device tape carrier as set forth in claim 7, wherein, in a case where an outer width of the semiconductor device in the longitudinal direction is greater than X times and not greater than X+(¼) times of the predetermined interval of the sprocket holes, the wire patterns are provided at an interval of X+(¼) times of the predetermined interval of the sprocket holes.

10. The semiconductor device tape carrier as set forth in claim 7, wherein the semiconductor device is a COF or a TCP.

11. A semiconductor device composed of a semiconductor device tape carrier comprising:
an insulative tape of a thin film on which a plurality of wire patterns is provided;
a semiconductor element; and
an insulative resin which seals the semiconductor element and the wire patterns under the semiconductor element in a state where the semiconductor element is conducted to the wire patterns, wherein:
   the sealed semiconductor element and the wire patterns conducted to each other form a semiconductor device, and a plurality of sprocket holes for carrying the insulative tape is formed at a predetermined interval in a longitudinal direction of the semiconductor device tape carrier, and
   in a case where an outer width of the semiconductor device in the longitudinal direction is greater than X times and not greater than X+Y times of the predetermined interval of the sprocket holes, the wire patterns are provided at an interval of X+Y times of the predetermined interval of the sprocket holes, X being a natural number, Y being a decimal being greater than 0 and less than 1.

12. A semiconductor module device made of a semiconductor device composed of a semiconductor device tape carrier comprising:
an insulative tape of a thin film on which a plurality of wire patterns is provided;
a semiconductor element; and
an insulative resin which seals the semiconductor element and the wire patterns under the semiconductor element in a state where the semiconductor element is conducted to the wire patterns, wherein:
   the sealed semiconductor element and the wire patterns conducted to each other form a semiconductor device, and a plurality of sprocket holes for carrying the insulative tape is formed at a predetermined interval in a longitudinal direction of the semiconductor device tape carrier, and
   in a case where an outer width of the semiconductor device in the longitudinal direction is greater than X times and not greater than X+Y times of the predetermined interval of the sprocket holes, the wire patterns are provided at an interval of X+Y times of the predetermined interval of the sprocket holes, X being a natural number, Y being a decimal being greater than 0 and less than 1.

* * * * *